(12) United States Patent
Jung et al.

(10) Patent No.: US 9,362,333 B2
(45) Date of Patent: Jun. 7, 2016

(54) SEMICONDUCTOR PACKAGES AND DISPLAY DEVICES INCLUDING SEMICONDUCTOR PACKAGES

(71) Applicant: Samsung Electronics Co., Ltd., Suwon-si (KR)

(72) Inventors: Jae-Min Jung, Seoul (KR); Jeong-Kyu Ha, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/327,138

(22) Filed: Jul. 9, 2014

(65) Prior Publication Data
US 2015/0060931 A1 Mar. 5, 2015

(30) Foreign Application Priority Data
Aug. 27, 2013 (KR) .................. 10-2013-0101925

(51) Int. Cl.
| | |
|---|---|
| H01L 27/15 | (2006.01) |
| H01L 23/498 | (2006.01) |
| H01L 23/538 | (2006.01) |
| H01L 23/14 | (2006.01) |
| H01L 23/00 | (2006.01) |

(52) U.S. Cl.
CPC ............ *H01L 27/15* (2013.01); *H01L 23/4985* (2013.01); *H01L 23/5387* (2013.01); *H01L 23/145* (2013.01); *H01L 24/16* (2013.01); *H01L 2224/131* (2013.01); *H01L 2224/16227* (2013.01); *H01L 2224/73204* (2013.01); *H01L 2924/12041* (2013.01); *H01L 2924/12044* (2013.01)

(58) Field of Classification Search
CPC ....... H05K 3/323; H05K 3/361; H05K 1/028; H05K 1/118; H05K 1/189; H01L 23/5387
See application file for complete search history.

(56) References Cited

U.S. PATENT DOCUMENTS

| | | | |
|---|---|---|---|
| 7,435,914 | B2 | 10/2008 | Cheng |
| 8,456,603 | B2 | 6/2013 | Takenaka |
| 2005/0233613 | A1 | 10/2005 | Naitoh et al. |
| 2009/0223709 | A1 | 9/2009 | Park |
| 2010/0032199 | A1* | 2/2010 | Bentley ............ G06K 19/07745 174/261 |

FOREIGN PATENT DOCUMENTS

| | | |
|---|---|---|
| JP | 2005-234335 | 9/2005 |
| KR | 10-2000-0038523 A | 7/2000 |
| KR | 10-2007-0047014 A | 5/2007 |
| KR | 10-2009-0096171 A | 9/2009 |
| KR | 10-2011-0034789 A | 4/2011 |
| KR | 10-2012-0088332 A | 8/2012 |

* cited by examiner

*Primary Examiner* — Tucker J Wright
(74) *Attorney, Agent, or Firm* — Myers Bigel & Sibley, P.A.

(57) ABSTRACT

Semiconductor packages are provided. A semiconductor package may include a semiconductor chip. The semiconductor package may include a substrate and first and second conductive regions on the substrate. In some embodiments, the substrate may be a flexible substrate, and the first and second conductive regions may be on the same surface of the flexible substrate. Display devices including semiconductor packages are also provided. In some embodiments, a display device may include a flexible substrate that is bent such that first and second conductive regions thereof are connected to each other via an intervening third conductive region.

23 Claims, 12 Drawing Sheets

SEMICONDUCTOR PACKAGES AND DISPLAY DEVICES INCLUDING SEMICONDUCTOR PACKAGES

CROSS-REFERENCE TO RELATED APPLICATION

This U.S. non-provisional patent application claims priority under 35 U.S.C. §119 to Korean Patent Application No. 10-2013-0101925, filed on Aug. 27, 2013, in the Korean Intellectual Property Office, the entire contents of which are hereby incorporated herein by reference.

BACKGROUND

The present disclosure herein relates to semiconductor packages. Electronic device size, thickness, and weight have decreased. For example, an organic light-emitting diode device can provide technical advantages such as low power consumption, high brightness, high response speed, and so forth, and may thus be used as a display device for mobile devices. Because an organic light-emitting diode device is self-luminous, it may be possible to realize a reduced thickness compared with display devices with an additional light source (e.g., a liquid-crystal display device). Accordingly, the organic light-emitting diode device may be used with thin devices. To reduce a thickness of a display device, a chip-on-film package technology may be being used to package a semiconductor chip for driving a display panel of a display device. Some chip-on-film package technologies, however, may have reliability issues.

SUMMARY

Example embodiments of present inventive concepts may provide a chip-on-film package with high reliability and a display device including the same. In particular, example embodiments of inventive concepts may provide a chip-on-film package configured to protect/prevent a wire from being damaged when the chip-on-film package is bent to connect the wire to a display panel of a display device, and may thereby prevent a signal transmission failure from occurring between a semiconductor chip and the display panel.

For example, various embodiments of present inventive concepts provide a chip-on-film package that may include a film substrate including first and second surfaces on opposite sides, respectively, of the film substrate. The chip-on-film package may include a semiconductor chip mounted on the first surface of the film substrate. The chip-on-film package may include a first wire on the second surface of the film substrate and adjacent an end portion of the film substrate. The chip-on-film package may include a second wire on the second surface of the film substrate, the second wire being spaced apart from the first wire along the second surface of the film substrate by a separation region positioned therebetween and being electrically connected to the semiconductor chip. Moreover, the chip-on-film package may include an anisotropic conductive film on a portion of the first wire and/or on a portion of the second wire, the portion of the first wire and/or the portion of the second wire being positioned adjacent the separation region.

In various embodiments, the film substrate may include a folded shape adjacent the separation region (e.g., a shape that is folded at/adjacent the separation region), and the respective portions of the first and second wires may be electrically connected to each other through the anisotropic conductive film. In some embodiments, the anisotropic conductive film may include at least one conductive particle and an insulating material, and the respective portions of the first and second wires may be connected to each other through the at least one conductive particle of the anisotropic conductive film.

According to various embodiments, the respective portions of the first and second wires may be respective first portions. The first wire may include the first portion thereof adjacent the separation region, and a second portion thereof connected to the first portion thereof. The second wire may include the first portion thereof adjacent the separation region, and a second portion thereof connected to the first portion thereof. Moreover, at least one of the first and second wires may be configured such that the first portion thereof has a first width that is wider than a second width of the second portion thereof.

In various embodiments, a first width of the portion of the first wire may either be narrower or wider than a second width of the portion of the second wire. In some embodiments, a first thickness of the portion of the first wire may either be thinner or thicker than a second thickness of the portion of the second wire.

According to various embodiments, the chip-on-film package may include a conductive via layer connected to the second wire through the film substrate. Moreover, the chip-on-film package may include a third wire on the first surface of the film substrate and electrically connecting the semiconductor chip to the conductive via layer. In some embodiments, the chip-on-film package may include a fourth wire on the first surface of the film substrate and electrically connected to the semiconductor chip. The third and fourth wires may be adjacent opposite sides, respectively, of the semiconductor chip.

A display device, according to various embodiments, may include a panel substrate, a display substrate on the panel substrate, a circuit substrate, and a chip-on-film package. The chip-on-film package may include a film substrate that includes first and second surfaces on opposite sides, respectively, of the film substrate. The chip-on-film package may include a folding portion, a semiconductor chip mounted on the first surface of the film substrate, and first and second wires on the second surface of the film substrate. The first wire may be electrically connected to the panel substrate, and the second wire may be spaced apart from the first wire along the second surface of the film substrate and may be electrically connected to the semiconductor chip. Moreover, the chip-on-film package may include an anisotropic conductive film adjacent the folding portion, where the first and second wires may be electrically connected to each other through the anisotropic conductive film.

In various embodiments, the first wire may include a first portion on the anisotropic conductive film, may include a second portion electrically connected to the panel substrate, and may include a third portion between the first and second portions. Moreover, the second wire may have a portion that is on the anisotropic conductive film. In some embodiments, the portion of the second wire that is on the anisotropic conductive film may include a first portion of the second wire, and the second wire may include a second portion that is electrically connected to the first portion of the second wire. Moreover, the chip-on-film package may include a conductive via layer electrically connected to the second portion of the second wire through the film substrate, and may include a third wire on the first surface and electrically connecting the semiconductor chip with the conductive via layer.

According to various embodiments, the chip-on-film package may include a fourth wire on the first surface of the film substrate. The fourth wire may include a first portion adjacent the semiconductor chip, a second portion adjacent the circuit substrate, and a third portion between the first and second portions. In some embodiments, the first portion of the first wire may include a first width that is wider than a second width of the second portion of the first wire, and/or the first portion of the second wire may include a third width that is wider than a fourth width of the second portion of the second wire.

In various embodiments, the anisotropic conductive film may include at least one conductive particle and an insulating material, and the first portion of the first wire may be electrically connected to the portion of the second wire through the at least one conductive particle of the anisotropic conductive film. In some embodiments, a first width of the first portion of the first wire may either be narrower or wider than a second width of the portion of the second wire. In some embodiments, a first thickness of the first portion of the first wire may either be thinner or thicker than a second thickness of the portion of the second wire.

A display device, according to various embodiments, may include a package that includes a semiconductor chip. The package may include a flexible substrate that is bent such that a first portion of a surface thereof is opposite a second portion of the surface. The package may include a first conductive region that is on the first portion of the surface of the flexible substrate and that is configured to electrically connect to the semiconductor chip. The package may include a second conductive region that is on the second portion of the surface of the flexible substrate. The package may include a third conductive region that is between the first and second conductive regions and that is configured to electrically connect the first and second conductive regions. Moreover, the display device may include a display panel that is adjacent the second conductive region and is configured to electrically connect to the second conductive region.

In various embodiments, the surface of the flexible substrate may include a first surface of the flexible substrate, and the flexible substrate may include a second surface. The first and second surfaces of the flexible substrate may be on first and second opposite sides, respectively, of the flexible substrate. The display device may include a fourth conductive region that is on the second surface of the flexible substrate and that is adjacent the semiconductor chip. The display device may include a conductive via in the flexible substrate. The first conductive region may be configured to electrically connect to the fourth conductive region through the conductive via. Moreover, the first conductive region may be configured to electrically connect to the semiconductor chip through the fourth conductive region.

According to various embodiments, the package may be a chip-on-film package. The flexible substrate may be a flexible film substrate. The first, second, and fourth conductive regions may be respective pre-cut wires (e.g., first, second, and third pre-cut wires, respectively). The third conductive region may be an anisotropic conductive film. Moreover, the display device may be configured to transmit signals between the semiconductor chip and the display panel via the pre-cut wires.

In various embodiments, the pre-cut wires may have respective thermal conductivities (which may be equal or different in comparison with each other) that are higher than a thermal conductivity of the flexible film substrate. The anisotropic conductive film may be between a first portion of the first pre-cut wire and a first portion of the second pre-cut wire. The chip-on-film package may include a void between the respective first portions of the first and second pre-cut wires and a bend of the flexible film substrate. At least one of the first and second pre-cut wires may include a second portion adjacent the first portion thereof. Moreover, the chip-on-film package may include a wire protection layer on the second portion of the at least one of the first and second pre-cut wires.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
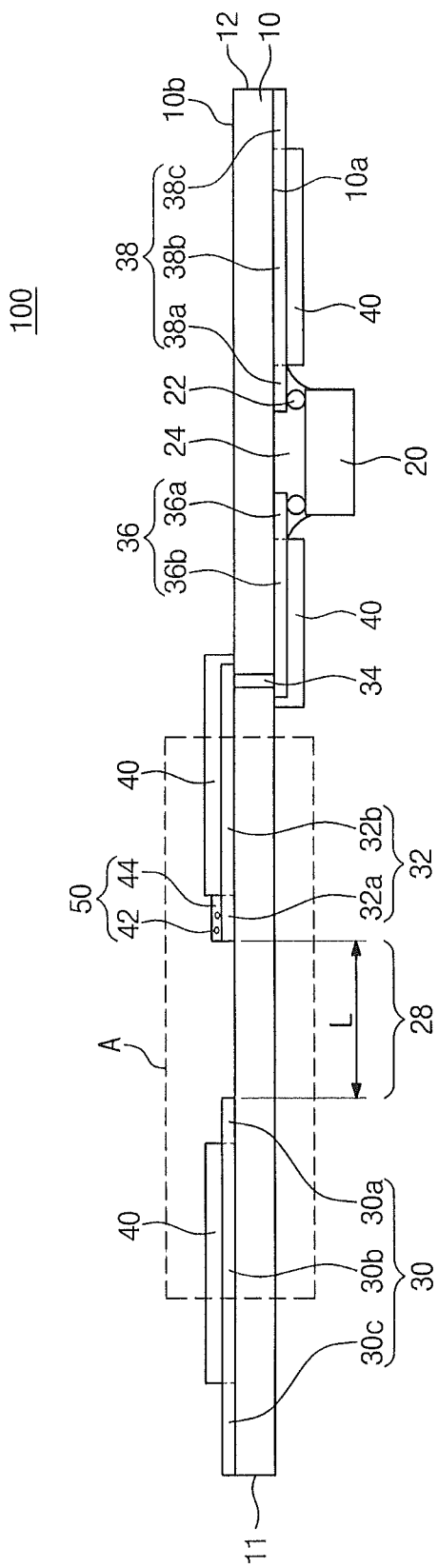
FIG. 1 is a sectional view of a chip-on-film package according to some example embodiments of present inventive concepts.

These figures are intended to illustrate the general characteristics of methods, structures, and/or materials used in certain example embodiments and to supplement the written description provided below. These drawings are not necessarily, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
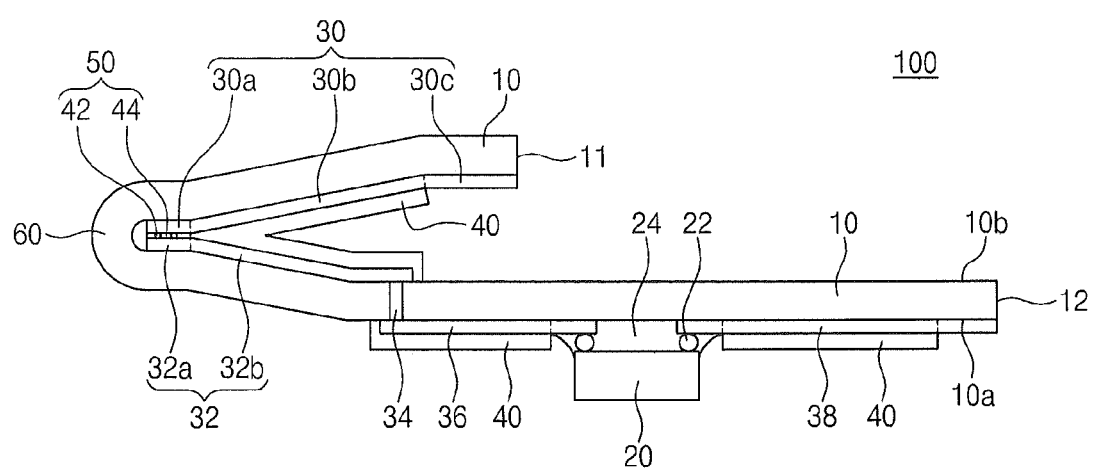
FIG. 2 is a sectional view illustrating a folded structure of the chip-on-film package of FIG. 1.

FIG. 1 is a sectional view of a chip-on-film package according to some example embodiments of present inventive concepts, and FIG. 2 is a sectional view illustrating a folded structure of the chip-on-film package of FIG. 1.

Referring to FIG. 1, according to some example embodiments of present inventive concepts, a chip-on-film package 100 may include a film substrate 10. The film substrate 10 may be formed of a resin-based material (e.g., polyimide or polyester) to have flexibility. The film substrate 10 may include a first surface 10a and a second surface 10b opposite the first surface 10a. A first wire 30 and a second wire 32 may be provided on the second surface 10b of the film substrate 10. A third wire 36 and a fourth wire 38 may be provided on the first surface 10a of the film substrate 10. A conductive via layer 34 may be provided through the film substrate 10 to connect the second wire 32 with the third wire 36. The first to fourth wires 30, 32, 36, and 38 and the conductive via layer 34 may be formed of or include a metallic material of high conductivity. Accordingly, respective conductive/metallic regions/layers may be provided in the form of the first to fourth wires 30, 32, 36, and 38. The first to fourth wires 30, 32, 36, and 38 and the conductive via layer 34 may include, for example, copper (Cu). The first to fourth wires 30, 32, 36, and 38 may have substantially the same thickness. Alternatively, the first and second wires 30 and 32 may have a thickness greater than that of the third and fourth wires 36 and 38. A portion of each of the first to fourth wires 30, 32, 36, and 38 may be covered with a wire protection layer 40. The wire protection layer 40 may include, for example, a solder resist material.

A semiconductor chip 20 may be mounted on the first surface 10a of the film substrate 10. In a display panel 140 of a display device 200 (shown in FIG. 14), the semiconductor chip 20 may serve as a gate driving chip for driving a gate line and/or a data driving chip for driving a data line. The semiconductor chip 20 may be disposed on and connected to the third wire 36 and the fourth wire 38 with a solder ball 22 interposed therebetween. A gap region between the film substrate 10 and the semiconductor chip 20 may be filled with an under-fill material 24. The under-fill material 24 may include, for example, a resin.

Figure 14:
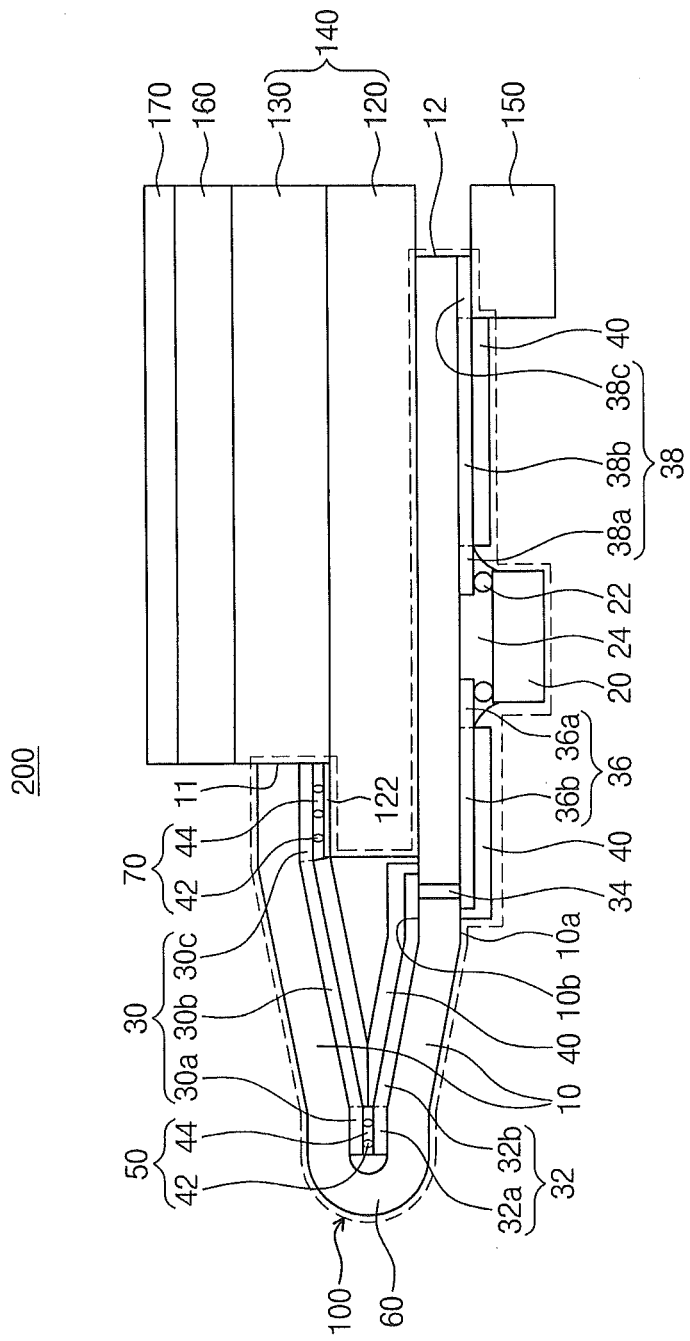
FIG. 14 is a sectional view schematically illustrating a portion of a display device including a chip-on-film package, according to some example embodiments of present inventive concepts.

The first and second wires 30 and 32 may be separated from each other by a separation region 28. A length L of the separation region 28 on the second surface 10b of the film substrate 10 may be determined in consideration of bendability/flexibility of the film substrate 10. The first wire 30 may be an output wire connected to the display panel 140 of the display device 200, as shown in FIG. 14. For example, the first wire 30 may be configured to allow a driving signal to be transmitted from the semiconductor chip 20 to the display panel 140 of the display device 200. The first wire 30 may be disposed adjacent an end portion 11 of the film substrate 10. In other words, the first wire 30 may extend from the separation region 28 to the end portion 11 of the film substrate 10. The first wire 30 may include a first portion 30a, a second portion 30b, and a third portion 30c. The first portion 30a of the first wire 30 may be a first end portion of the first wire 30 adjacent the separation region 28. The second portion 30b of the first wire 30 may be a base portion connecting the first portion 30a to the third portion 30c. The third portion 30c of the first wire 30 may be a second end portion of the first wire 30 adjacent the end portion 11 of the film substrate 10. In some embodiments, the third portion 30c of the first wire 30 may serve as an output terminal, which may be connected to, for example, a panel substrate 120 of the display panel 140, as shown in FIG. 14. The second portion 30b of the first wire 30 may be covered with the wire protection layer 40, while the first portion 30a and the third portion 30c may be exposed by the wire protection layer 40.

The second wire 32 may be a via-type connection wire connected to the conductive via layer 34. The second wire 32 may be spaced apart from the first wire 30 by the separation region 28. The second wire 32 may include a first portion 32a and a second portion 32b. The first portion 32a of the second wire 32 may be an end portion adjacent the separation region 28. The second portion 32b of the second wire 32 may be a base portion connected to the conductive via layer 34. The second portion 32b of the second wire 32 may include an end portion adjacent the conductive via layer 34. The second portion 32b of the second wire 32 may be covered with the wire protection layer 40. An anisotropic conductive film (ACF) 50 may be provided on the first portion 32a of the second wire 32. The anisotropic conductive film 50 may include at least one conductive particle 42 and an insulating material 44. The conductive particle 42 may form an electric pathway in the anisotropic conductive film 50, and the insulating material 44 may fasten the at least one conductive particle 42, and thus improve reliability in electrical connection and electrical isolation characteristics between adjacent ones of the wires 30 and 32. In other words, the anisotropic conductive film 50 may be configured to isolate the opposing surfaces of the first and second wires 30 and 32, respectively, but also to electrically couple these surfaces to each other, when the film substrate 10 is folded. The conductive particle 42 may include a metallic material. Accordingly, a conductive/metallic region may be provided in the form of the anisotropic conductive film 50. The conductive particle 42 may include, for example, nickel (Ni). The insulating material 44 may include, for example, an insulating resin.

The third wire 36 may include a first portion 36a and a second portion 36b. The third wire 36 may be connected to the semiconductor chip 20 and the conductive via layer 34, thereby serving as a chip connection wire. The first portion 36a of the third wire 36 may be connected to the semiconductor chip 20 through, for example, the solder ball 22. The first portion 36a of the third wire 36 may be covered with the under-fill material 24. The second portion 36b of the third wire 36 may be a base portion connected to the conductive via layer 34. The second portion 36b of the third wire 36 may include an end portion of the third wire 36, which is positioned adjacent the conductive via layer 34. The second portion 36b of the third wire 36 may be covered with the wire protection layer 40.

The fourth wire 38 may include a first portion 38a, a second portion 38b, and a third portion 38c. The fourth wire 38 may be connected to the semiconductor chip 20 and serve as a wire extending toward an opposite end portion 12 of the film substrate 10. The fourth wire 38 may be used as an input wire connected to a circuit substrate 150 of the display device 200, as shown in FIG. 14. The fourth wire 38 may serve as an input wire. For example, the fourth wire 38 may be configured to receive input signals from the circuit substrate 150 of the display device 200. The first portion 38a of the fourth wire 38 may be connected to the semiconductor chip 20 through the solder ball 22 and serve as a first end portion of the fourth wire 38. The first portion 38a of the fourth wire 38 may be covered with the under-fill material 24. The second portion 38b of the fourth wire 38 may be a base portion connecting the first portion 38a with the third portion 38c. The third portion 38c of the fourth wire 38 may be positioned adjacent the opposite end portion 12 of the film substrate 10 and serve as a second end portion of the fourth wire 38. The third portion 38c of the fourth wire 38 may serve as an input terminal. For example, as shown in FIG. 14, the third portion 38c of the fourth wire 38 may be connected to the circuit substrate 150 of the display device 200. The second portion 38b of the fourth wire 38 may be covered with the wire protection layer 40, while the third portion 38c may be exposed by the wire protection layer 40.

Referring to FIG. 2, according to some example embodiments, the chip-on-film package 100 may be provided to have a folded or bent shape, by virtue of its flexibility. For example, the film substrate 10 may include a folding portion 60 formed at the separation region 28 of FIG. 1. A bending profile (e.g., curvature) of the folding portion 60 may be controlled by adjusting a length L of the separation region 28, thicknesses of the first and second wires 30 and 32 and the anisotropic conductive film 50, and so forth.

If the first and second wires 30 and 32 were continuously connected without the separation region 28, to constitute a single wire, such a single wire could break at a folded/bent portion because the film substrate 10 may have a minimum radius curvature at the folded portion. In other words, if the wire does not have a sufficiently high flexibility (such as the high flexibility in the film substrate 10), then a high stress capable of causing damage on the wire may be applied to a portion of the wire positioned at the folding portion. Such damage on the wire may lead to the cutting of wires or a significant or non-uniform increase in electric resistance of wires. Furthermore, as the result of the damage on the wire, signals from the semiconductor chip 20 may not be properly transmitted to the display panel 140 of the display device 200 (e.g., of FIG. 14), and this may lead to deterioration in reliability of the package. By contrast, according to example embodiments of present inventive concepts, the wires in the chip-on-film package 100 are provided spaced apart from the folding portion 60, and, thus, the stress concentration and the consequent damage of the wire can be reduced/prevented. In other words, the chip-on-film package 100 may include a void (e.g., a gap or other space) between respective end portions of the first and second wires 30 and 32 and a bend/curve of the folding portion 60 of the film substrate 10.

The first and second wires 30 and 32, which are disposed adjacent the folding portion 60 to face each other, may be connected to each other by the anisotropic conductive film 50. In other words, the first and second wires 30 and 32 may be electrically connected to each other. For example, the first portions 30a and 32a of the first and second wires 30 and 32 may be connected to each other by the at least one conductive particle 42 of the anisotropic conductive film 50. Portions of the first portions 30a and 32a of the first and second wires 30 and 32, which are located adjacent the folding portion 60, and the anisotropic conductive film 50 interposed therebetween may be connected using a compression bonding process (for example, a thermo compression bonding process). As the result of the compression bonding process, the first portions 30a and 32a of the first and second wires 30 and 32 may be electrically connected to each other through the at least one conductive particle 42 in the anisotropic conductive film 50, and contact characteristics between the first portions 30a and 32a of the first and second wires 30 and 32 can be improved by the insulating material 44 of the anisotropic conductive film 50. In addition, electrical isolation characteristics between adjacent ones of the wires can be enhanced by the insulating material 44 of the anisotropic conductive film 50. In some embodiments, as a result of the compression bonding process, the anisotropic conductive film 50 may protrude toward the folding portion 60 of the film substrate 10 beyond a region between the first portions 30a and 32a of the first and second wires 30 and 32. The protection layers 40 on the first and second wires 30 and 32 may be connected to each other at a region adjacent the first portions 30a and 32a of the first and second wires 30 and 32. The second portion 30b of the first wire 30, along with the film substrate 10, may be at angle to the second surface 10b adjacent thereto and may face, for example, toward the fourth wire 38. A slope of the second portion 30b of the first wire 30 may be changed depending on, for example, a thickness of the display panel 140 of the display device 200 (which display device 200 is shown in FIG. 14). In other words, a shape of the third portion 30c of the first wire 30 may be changed to allow the first wire 30 to be easily bonded to, for example, the panel substrate 120 of the display device 200 of FIG. 14.

For the chip-on-film package 100 according to some example embodiments, it may be possible to protect/prevent the folding portion of the wire from being damaged by a stress and to thereby transmit signals from the semiconductor chip 20 without interruption. Accordingly, the chip-on-film package 100 can have high reliability. Further, the wires 30, 32, 36, and 38 in the chip-on-film package 100 may have a thermal conductivity higher than the film substrate 10, and this makes it possible to dissipate heat generated from the semiconductor chip 20 with efficiency. The wires 30, 32, 36, and 38 may be disposed on opposite surfaces of the film substrate 10, and, thus, the semiconductor chip 20 can have an improved electromagnetic interference (EMI) property.

Figure 3:
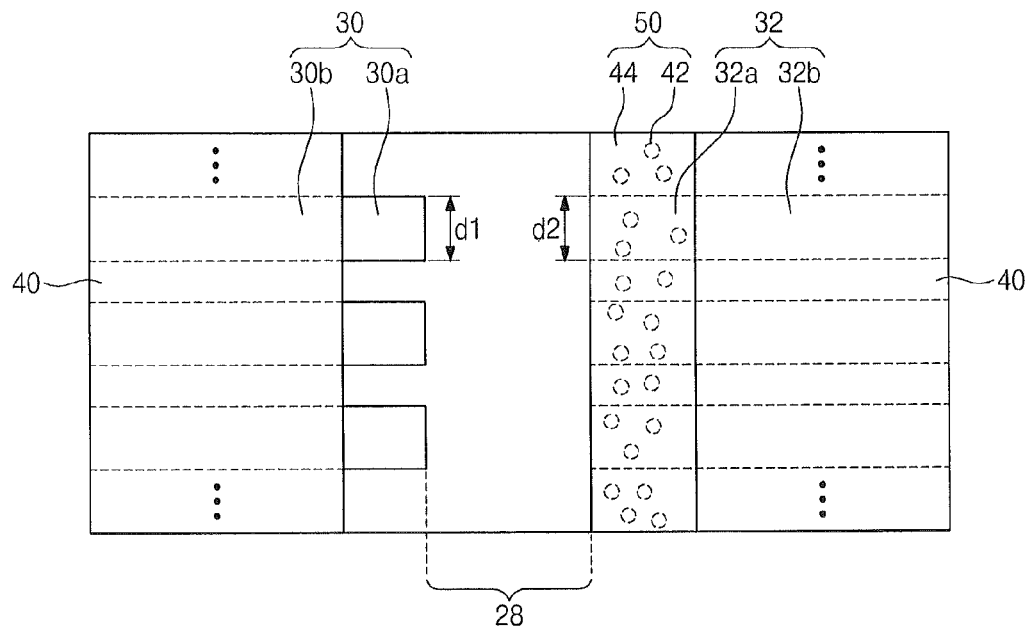
FIG. 3 is a plan view schematically illustrating a region A of FIG. 1.

FIG. 3 is a plan view schematically illustrating a region A of FIG. 1. Referring to FIG. 3, a plurality of first wires 30 may be arranged side-by-side and spaced apart from each other, and a plurality of second wires 32 may be arranged side-by-side and spaced apart from each other. Further, the first wires 30 and the second wires 32 may be disposed at both (e.g., opposing) sides of the separation region 28 and may be spaced apart from each other. Each of the first wires 30 may be disposed to face a corresponding one of the second wires 32. For example, the first portions 30a and 32a of the first and second wires 30 and 32 may be arranged to face each other and have mirror symmetry with respect to the separation region 28. The first wire 30 may have a width d1, and the second wire 32 may have a width d2. In certain embodiments, each of the first wires 30 may have the same width as each of the second wire 32 (i.e., d1=d2). The wire protection layer 40 may be provided to cover top and side surfaces of the second portion 30b of each of the first wires 30. Further, the wire protection layer 40 may cover portions of the film substrate 10 between the second portions 30b of the first wires 30. The anisotropic conductive film 50 may be provided to cover top and side surfaces of each of the first portions 32a of the second wires 32. The anisotropic conductive film 50 may cover portions of the film substrate 10 between the first portions 32a of the second wires 32. In some embodiments, the anisotropic conductive film 50 may extend toward the separation region 28 and may cover side surfaces of the second wires 32 adjacent the separation region 28. Top and side surfaces of the second portion 32b of each of the second wires 32 may be covered with the wire protection layer 40. In addition, portions of the film substrate 10 between the second portions 32b of the second wires 32 may also be covered with the wire protection layer 40.

Figure 4:
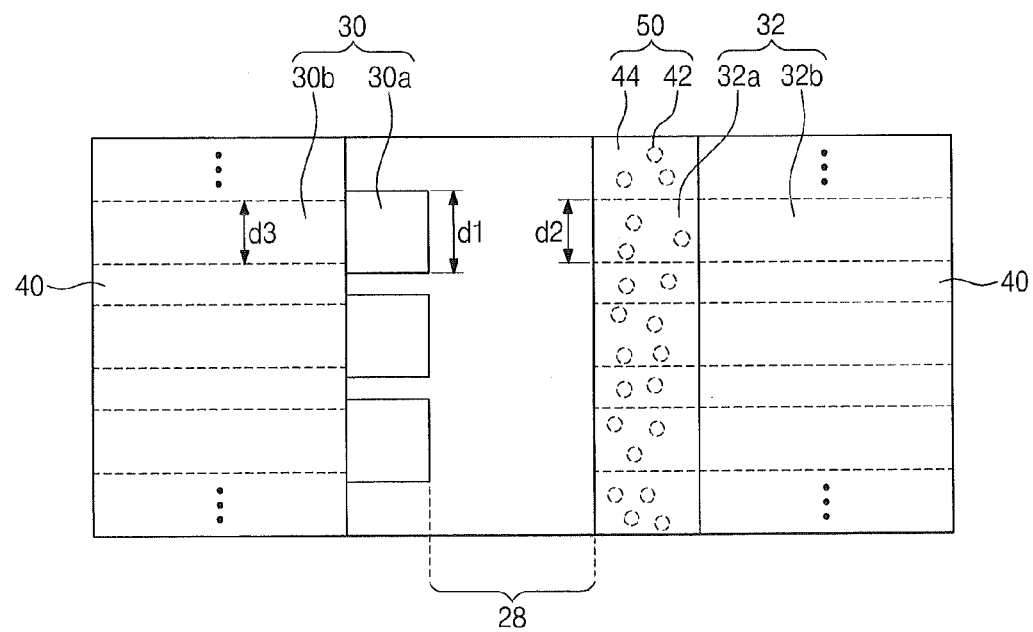
FIGS. 4 through 6 are plan views illustrating some examples of widths of first and second wires of the chip-on-film package.
Figure 5:
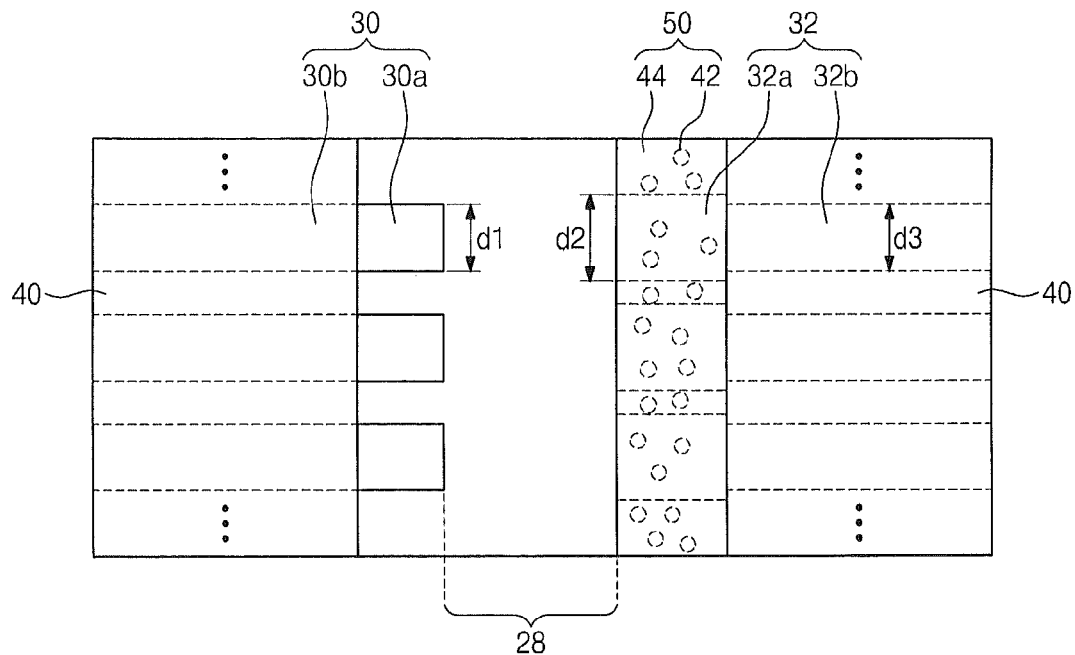
Figure 6:
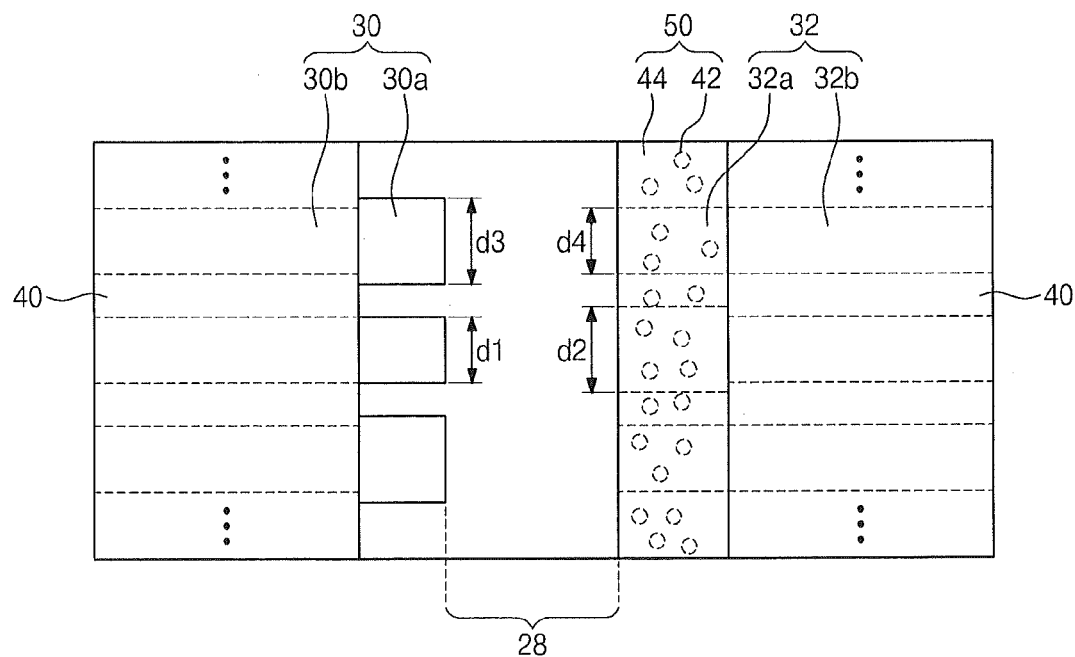

FIGS. 4 through 6 are plan views illustrating some examples of widths of the first and second wires 30 and 32 of the chip-on-film package 100. Referring to FIG. 4, the first portion 30a of the first wire 30 may have a width d1, and the second portion 30b may have a width d3. The width d1 of the first portion 30a of the first wire 30 may be greater than the width d3 of the second portion 30b. The first portion 32a of the second wire 32 may have a width d2. The width d1 of the first portion 30a of the first wire 30 may be greater than the width d2 of the first portion 32a of the second wire 32. The width of the second portion 32b of the second wire 32 may be substantially equivalent to that of the first portion 32a.

Referring to FIG. 5, the first portion 32a of the second wire 32 may have a width d2, and the second portion 32b may have a width d3. The width d2 of the first portion 32a of the second wire 32 may be greater than the width d3 of the second portion 32b. The width d2 of the first portion 32a of the second wire 32 may be greater than the width d1 of the first portion 30a of the first wire 30. The width of the second portion 30b of the first wire 30 may be substantially equivalent to that of the first portion 30a.

Referring to FIG. 6, ones of the first wires 30 having the first portions 30a having a width d1 may be alternately arranged with ones of the first wires 30 having the first portions 30a having a width d3. The width d1 may be smaller than the width d3. Ones of the second wires 32 having the first portions 32a having a width d2 may be alternately arranged with ones of the second wires 32 having the first portions 32a having the width d4. The width d2 may be greater than the width d4. Ones of the first wires 30 having the first portions 30a having the width d1 may be disposed to face ones of the second wires 32 having the first portions 32a having the width d2, respectively. Ones of the first wires 30 having the first portions 30a having the width d3 may be disposed to face ones of the second wires 32 having the first portions 32a having the width d4, respectively. The width d1 may be smaller than the width d2, and the width d3 may be greater than the width d4. The widths d1 and d4 may be substantially equivalent to each other, and the widths d2 and d3 may be substantially equivalent to each other.

As described with reference to FIGS. 4 through 6, the first and second wires 30 and 32 including the first portions 30a and 32a having at least two different widths may be disposed on the film substrate 10 to face each other. Accordingly, when the chip-on-film package 100 is folded or bent as described with reference to FIG. 2, it may be possible to increase an area for connecting the first wire 30 with the second wire 32.

Figure 7:
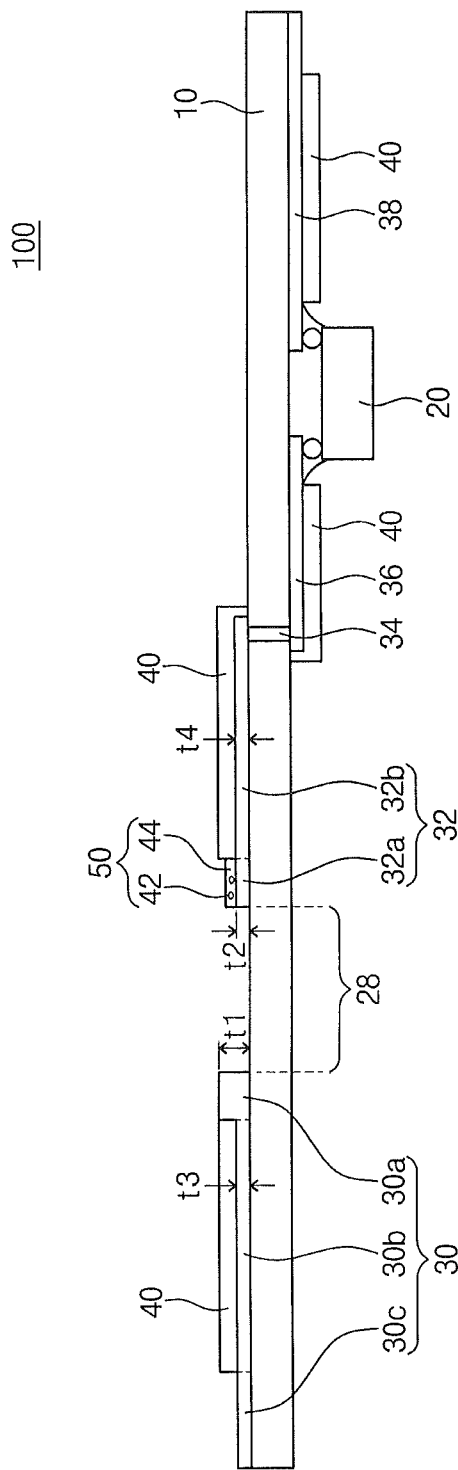
FIGS. 7 through 9 are sectional views illustrating some examples of thicknesses of first and second wires of the chip-on-film package.
Figure 8:
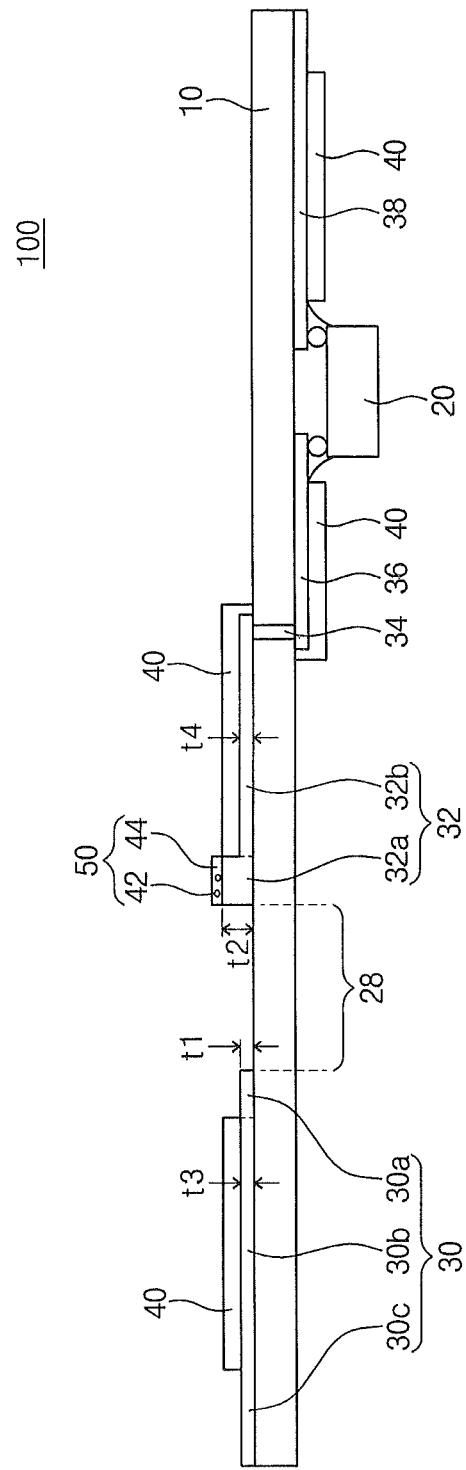
Figure 9:
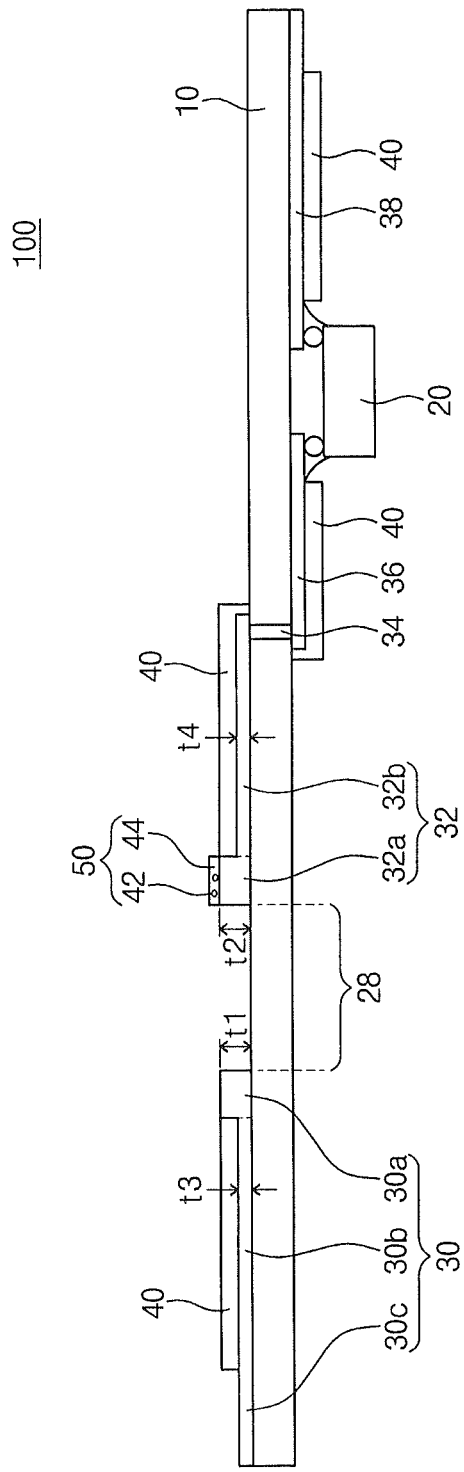

FIGS. 7 through 9 are sectional views illustrating some examples of thicknesses of the first and second wires 30 and 32 of the chip-on-film package 100. Referring to FIG. 7, the first wire 30 may include the first portion 30a having a thickness of t1 and the second portion 30b having a thickness of t3. The second wire 32 may include the first portion 32a having a thickness of t2 and the second portion 32b having a thickness of t4. The thickness t1 of the first portion 30a of the first wire 30 may be greater than the thickness t3 of the second portion 30b. The thickness t1 of the first portion 30a of the first wire 30 may be greater than the thickness t2 of the first portion 32a of the second wire 32. The thickness t2 of the first portion 32a of the second wire 32 may be substantially equivalent to the thickness t3 of the second portion 30b of the first wire 30. Further, the thickness t2 of the first portion 32a of the second wire 32 may be substantially equivalent to the thickness t4 of the second portion 32b.

Referring to FIG. 8, the first wire 30 may include the first portion 30a having a thickness of t1 and the second portion 30b having a thickness of t3. The second wire 32 may include the first portion 32a having a thickness of t2 and the second portion 32b having a thickness of t4. The thickness t2 of the first portion 32a of the second wire 32 may be greater than the thickness t4 of the second portion 32b of the second wire 32. The thickness t2 of the first portion 32a of the second wire 32 may be greater than the thickness t1 of the first portion 30a of the first wire 30. The thickness t1 of the first portion 30a of the first wire 30 may be substantially equivalent to the thickness t4 of the second portion 32b of the second wire 32. The thickness t1 of the first portion 30a of the first wire 30 may be substantially equivalent to the thickness t3 of the second portion 30b.

Referring to FIG. 9, the first wire 30 may include the first portion 30a having a thickness of t1 and the second portion 30b having a thickness of t3. The second wire 32 may include the first portion 32a having a thickness of t2 and the second portion 32b having a thickness of t4. The thickness t1 of the first portion 30a of the first wire 30 may be greater than the thickness t3 of the second portion 30b. The thickness t2 of the first portion 32a of the second wire 32 may be greater than the thickness t4 of the second portion 32b. The thickness t1 of the first portion 30a of the first wire 30 may be substantially equivalent to the thickness t2 of the first portion 32a of the second wire 32. The thickness t3 of the second portion 30b of the first wire 30 may be substantially equivalent to the thickness t4 of the second portion 32b of the second wire 32.

As described with reference to FIGS. 7 through 9, at least one of the first portions 30a and 32a of the first and second wires 30 and 32 may be thicker than the other portions of the first and second wires 30 and 32. By virtue of such a thickness relationship of the first portions 30a and 32a, the first portions 30a and 32a of the first and second wires 30 and 32 may be relatively easily and effectively connected to each other. For example, as a result of the thickness relationship of the first portions 30a and 32a, an adhesive property between the first and second wires 30 and 32 and the anisotropic conductive film 50 can be improved.

Figure 10:
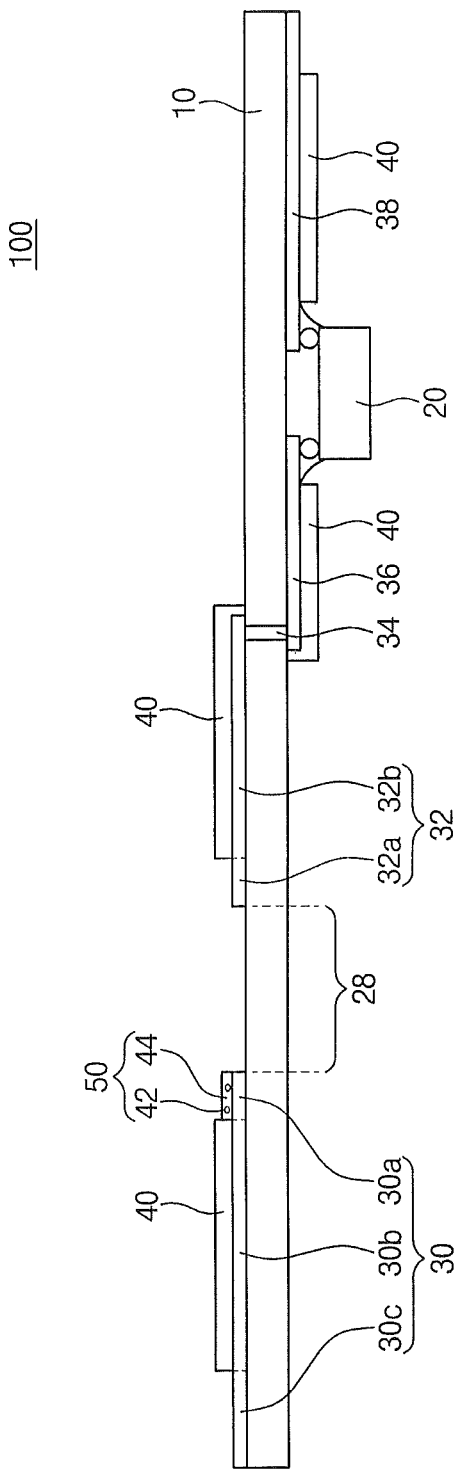
FIGS. 10 and 11 are sectional views illustrating some examples of positions of an anisotropic conductive film on the chip-on-film package.
Figure 11:
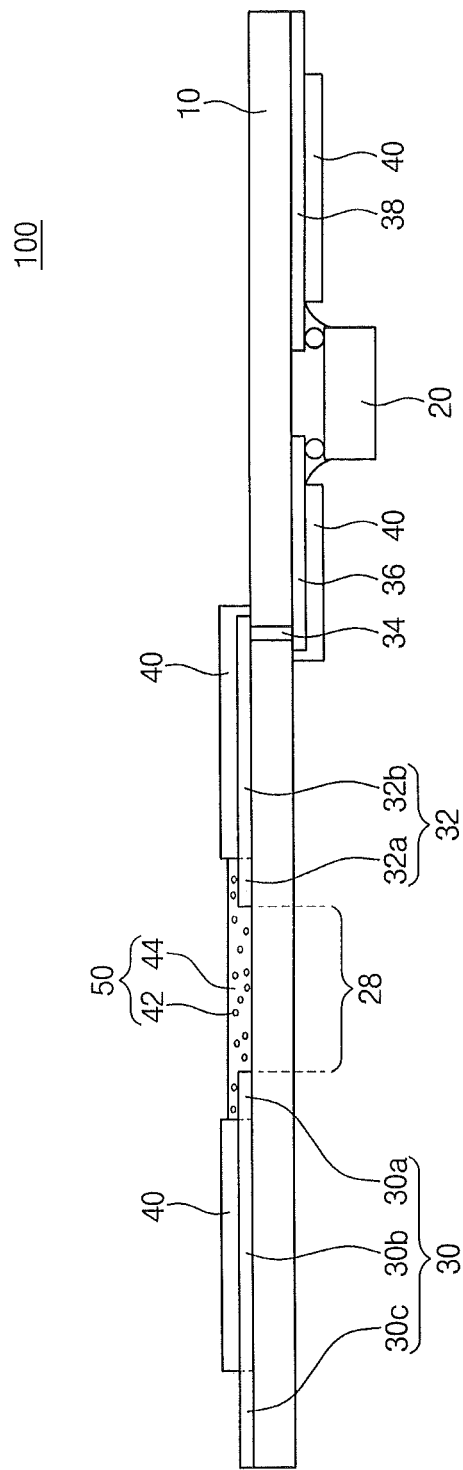

FIGS. 10 and 11 are sectional views illustrating some examples of positions of the anisotropic conductive film 50 on the chip-on-film package 100. Referring to FIG. 10, the anisotropic conductive film 50 may be disposed on the first portion 30a of the first wire 30. Alternatively, the anisotropic conductive film 50 may be extended from a top surface of the first portion 30a of the first wire 30 to cover a side surface of the first portion 30a. Furthermore, the anisotropic conductive film 50 may include a portion extending toward the separation region 28. For example, as shown in FIG. 11, the anisotropic conductive film 50 may be provided to cover the first portion 30a of the first wire 30, the second portion 30b of the second wire 32, and the separation region 28.

Figure 12:
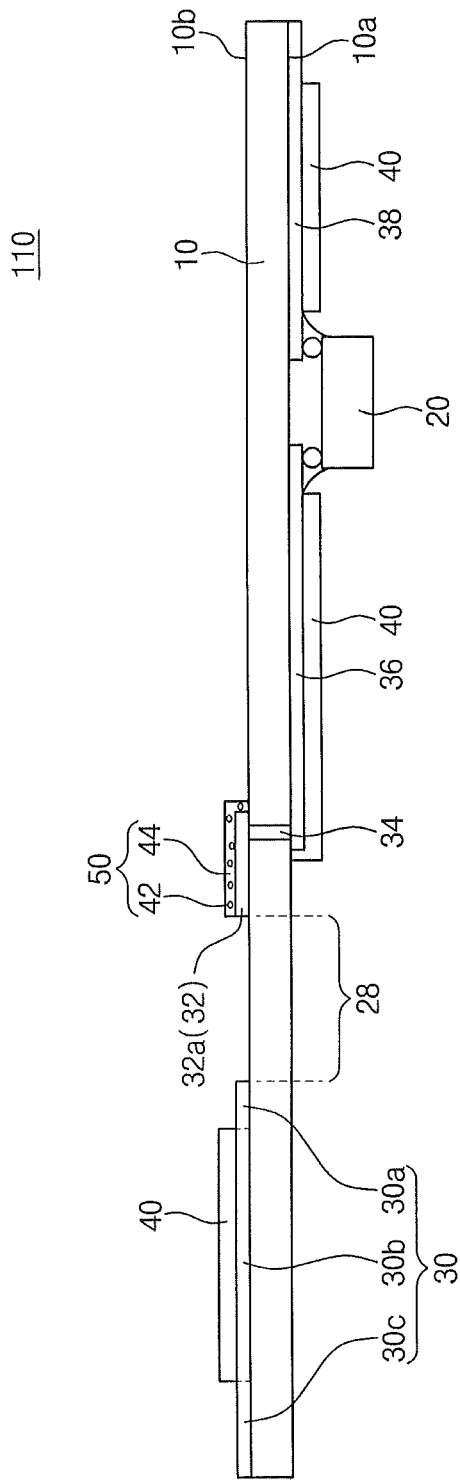
FIG. 12 is a sectional view of a chip-on-film package according to some example embodiments of present inventive concepts.
Figure 13:
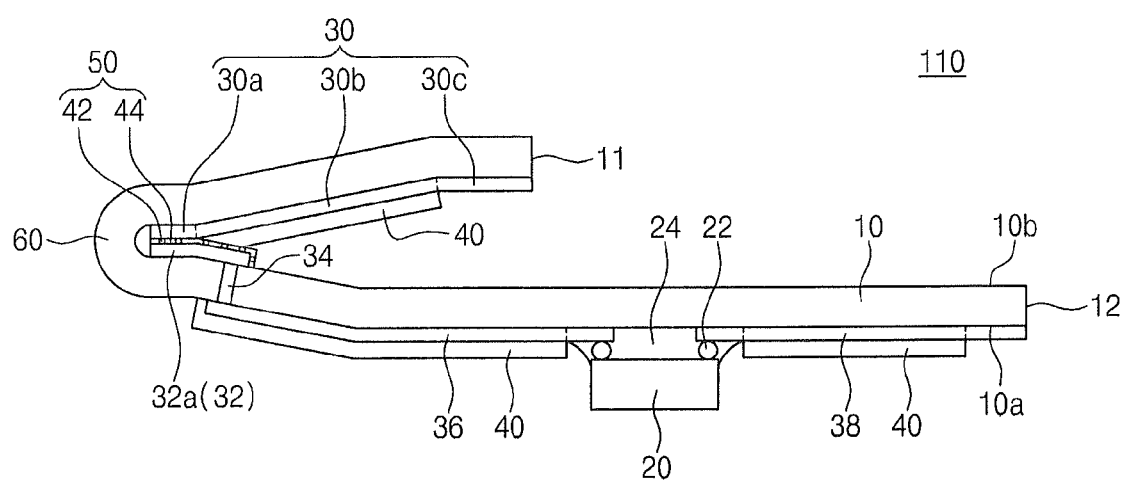
FIG. 13 is a sectional view illustrating a folded structure of the chip-on-film package of FIG. 12.

FIG. 12 is a sectional view of a chip-on-film package 110 according to some example embodiments of present inventive concepts, and FIG. 13 is a sectional view illustrating a folded structure of the chip-on-film package 110. Hereinafter, for concise description, elements previously described with reference to FIG. 1 may be identified by a similar or identical reference number without repeating an overlapping description thereof.

Referring to FIG. 12, according to some example embodiments of present inventive concepts, a chip-on-film package 110 may include a second wire 32 consisting of only the first portion 32a, unlike the second wire 32 of FIG. 1. For example, the second wire 32 may be provided on the second surface 10b of the film substrate 10 and may have a length shorter than the first wire 30. In some example embodiments, a length of the second wire 32 may be 1/10 to 1/2 of that of the first wire 30. The second wire 32 may be connected to the conductive via layer 34. The anisotropic conductive film 50 may be provided on the second wire 32. For example, the conductive via layer 34 may be connected to the first portion 32a of the second wire 32. The anisotropic conductive film 50 may be provided to cover an end portion of the first portion 32a of the second wire 32 located distal and apart from the separation region 28. The anisotropic conductive film 50 may serve as a wire protection layer protecting the second wire 32. The third wire 36 may extend from the semiconductor chip 20 toward the separation region 28, and may thereby be longer than the second wire 32.

Referring to FIG. 13, the first and second wires 30 and 32 may be connected to each other, near the folding portion 60 of the film substrate 10, through the anisotropic conductive film 50. Accordingly, the first wire 30 and the second wire 32 may be electrically connected to each other through the anisotropic conductive film 50. For example, the first portion 30a of the first wire 30 and the first portion 32a of the second wire 32 may be electrically connected to each other through the at least one conductive particle 42 included in the anisotropic conductive film 50. The first portion 30a of the first wire 30, the first portion 32a of the second wire 32, and the anisotropic conductive film 50 therebetween may be connected to each other using a compression bonding process. The anisotropic conductive film 50 may be in contact with the wire protection layer 40 on the first wire 30. Because the second portion 30b of the first wire 30 is covered with the wire protection layer 40, it may be possible to suppress/protect the second portion 30b of the first wire 30 from being unintentionally connected to the anisotropic conductive film 50. The conductive via layer 34 may be disposed adjacent the folding portion 60.

FIG. 14 is a sectional view schematically illustrating a portion of the display device 200 including the chip-on-film package 100 according to some example embodiments of present inventive concepts. Referring to FIG. 14, the display device 200 may include a chip-on-film package 100, a display panel 140, and a circuit substrate 150.

The circuit substrate 150 may be a printed circuit board (e.g., a flexible printed circuit board (FPCB)). The circuit substrate 150 may be configured to receive a variety of signals from outside of the display device 200 and may output a variety of control signals for driving the semiconductor chip 20 in the chip-on-film package 100, and the semiconductor chip 20 may be configured to output driving signals for driving the display panel 140, in response to the control signals. The display panel 140 may display images in response to the driving signals from the semiconductor chip 20.

The display panel 140 may include a panel substrate 120 and a display substrate 130. The panel substrate 120 may include a resin-based material having flexibility. For example, the panel substrate 120 may include polyimide or polyester. If the panel substrate 120 is formed of a flexible material, the display device 200 may be used as a flexible display device. However, example embodiments of present inventive concepts are not limited to the above example of the panel substrate 120 that is formed to have flexibility. For example, the panel substrate 120 may be formed of glass. The panel substrate 120 may include wires for transmitting signals to the display substrate 130, and input pads 122 may be provided on an end portion of the panel substrate 120.

The display substrate 130 may be provided on the panel substrate 120 to display images. In example embodiments, the display substrate 130 may include an organic light-emitting diode device (OLED). The organic light-emitting device may include a light-emitting material, in which an electro luminescence effect can be realized. The organic light-emitting diode device may be a passive- or active-matrix-type organic light-emitting diode device. However, example embodiments of present inventive concepts are not limited to the example in which the display substrate 130 is an organic light-emitting diode device (OLED). For example, the display substrate 130 may be a liquid crystal panel substrate.

A touch panel 160 and a protection layer 170 may be further provided on the display substrate 130. The touch panel 160 may include at least one touch-sensing device. The touch-sensing device may include a plurality of touch-sensing electrodes and/or a conductive matrix.

The panel substrate 120 and the circuit substrate 150 may be electrically connected to respective end portions of the chip-on-film package 100. For example, the panel substrate 120 may be electrically connected to the third portion 30c of the first wire 30 of the chip-on-film package 100, and the circuit substrate 150 may be electrically connected to the third portion 38c of the fourth wire 38 of the chip-on-film package 100.

The chip-on-film package 100 illustrated in FIG. 14 may be replaced with one of the chip-on-film packages described with reference to FIGS. 1 through 13. The semiconductor chip 20 of the chip-on-film package 100 may serve as a gate driving integrated circuit (IC) for driving gate lines of the display panel 140 and/or may serve as a data driving IC for driving data lines of the display panel 140. The semiconductor chip 20 may be configured to receive signals input from the circuit substrate 150 through the fourth wire 38, generate gate and/or data driving signals, and output the gate and/or data lines of the display panel 140 through the first wire 30.

In the display device 200, the chip-on-film package 100 may be folded in such a way that the panel substrate 120 and the circuit substrate 150 may be electrically connected to each other. As a thickness of the display panel 140 decreases, the folding portion 60 of the chip-on-film package 100 may have an increased folding degree (e.g., a decreased radius curvature). The chip-on-film package 100 may include the first and second wires 30 and 32 provided on the second surface 10b of the film substrate 10. The chip-on-film package 100 may include the semiconductor chip 20 mounted on the first surface 10a of the film substrate 10 and the third and fourth wires 36 and 38 connected thereto. The chip-on-film package 100 may be connected to the third wire 36 and may include the conductive via layer 34 penetrating the film substrate 10. The second wire 32 may be connected to the semiconductor chip 20 through the conductive via layer 34 and the third wire 36.

The first and second wires 30 and 32 may be connected to each other through the anisotropic conductive film 50 disposed adjacent the folding portion 60. In particular, the first and second wires 30 and 32 may be electrically connected to each other by the anisotropic conductive film 50. In the chip-on-film package 100, the first and second wires 30 and 32 may be disposed spaced apart from the folding portion 60 and from each other, and it may thus be possible to prevent/protect against a stress from being concentrated to the first and second wires 30 and 32. This may make it possible to effectively and reliably transmit signals from the semiconductor chip 20 to the display panel 140, and the display device 200 can thus have high reliability.

The first portion 30a of the first wire 30 may be electrically connected to the first portion 32a of the second wire 32 through the at least one conductive particle 42 of the anisotropic conductive film 50. Portions of the first portions 30a and 32a of the first and second wires 30 and 32 that are located adjacent the folding portion 60, as well as the anisotropic conductive film 50 therebetween, may be connected using a compression bonding process (e.g., a thermo compression bonding process). As a result of the compression bonding process, the first portions 30a and 32a of the first and second wires 30 and 32 may be electrically connected to each other through the at least one conductive particle 42 in the anisotropic conductive film 50. The insulating material 44 of the anisotropic conductive film 50 may contribute to improving contact characteristics between the first portions 30a and 32a of the first and second wires 30 and 32. In addition, electrical isolation characteristics between adjacent ones of the wires 30 and 32 can be enhanced by the insulating material 44 of the anisotropic conductive film 50. In some embodiments, as a result of the compression bonding process, the anisotropic conductive film 50 may be extended toward the folding portion 60 of the film substrate 10. The wire protection layers 40 on each of the first and second wires 30 and 32 may be connected to each other at a region adjacent the first portions 30a and 32a of the first and second wires 30 and 32.

The chip-on-film package 100 and the panel substrate 120 may be connected to each other via another (e.g., a second) anisotropic conductive film 70. Accordingly, the chip-on-film package 100 and the panel substrate 120 may be electrically connected to each other. For example, the third portion 30c of the first wire 30 of the chip-on-film package 100 may be connected to the input pad 122 of the panel substrate 120 by the another anisotropic conductive film 70. The third portion 30c of the first wire 30, the input pad 122 of the panel substrate 120, and the another anisotropic conductive film 70 therebetween may be connected using a compression bonding process (e.g., a thermo compression bonding process).

As a result of the compression bonding process, the third portion 30c of the first wire 30 and the input pad 122 of the panel substrate 120 may be electrically connected to each other through the at least one conductive particle 42 of the another anisotropic conductive film 70, and contact characteristics therebetween may be improved by the insulating material 44 of the another anisotropic conductive film 70. In some embodiments, the compression bonding process for connecting the first wire 30 to the second wire 32 may be performed when the chip-on-film package 100 is folded to be connected to the panel substrate 120. In some embodiments, a folded structure of the chip-on-film package 100 shown in FIG. 2 and the panel substrate 120 may be connected to each other by a compression bonding process. For example, the chip-on-film package 100, in which the first wire 30 and the second wire 32 are connected to each other by the anisotropic conductive film 50, may be connected to the panel substrate 120 by a compression bonding process.

In some example embodiments, the display device 200 may include the chip-on-film package 100 or 110, in which separated wires are connected to each other at the folding portion. Accordingly, it may be possible to prevent/protect the wires from being damaged by a stress occurring at the folding portion 60 of the chip-on-film package 100 or 110 and thereby prevent/protect signals from not being transmitted between the semiconductor chip 20 and the display panel 140. As a result, signals can be stably transmitted between the semiconductor chip 20 and the display panel 140, and consequently, the chip-on-film package 100 or 110 and the display device 200 including the same can have high reliability.

When the display device 200 is operated, a temperature of the semiconductor chip 20 may be increased. Because each of the first to fourth wires 30, 32, 36, and 38 contains a metal material, it can have a thermal conductivity higher than the film substrate 10. Accordingly, the chip-on-film package 100 or 110 may efficiently dissipate heat generated from the semiconductor chip 20 to a location outside of the display device 200. Furthermore, because the wires 30, 32, 36, and 38 are provided on two opposite surfaces 10a and 10b of the film substrate 10, it may be possible to protect the semiconductor chip 20 from the external electro-magnetic interference (EMI). In other words, the semiconductor chip 20 can have an improved EMI property.

The chip-on-film packages 100 and 110 according to some example embodiments of present inventive concepts may be used to realize an organic light-emitting diode device or a liquid-crystal display device. Further, the chip-on-film packages 100 and 110 may be used to realize all types of electronic devices with a display device, such as portable devices (e.g., a cellular phone and a personal digital assistant (PDA)), or a laptop computer.

According to example embodiments of present inventive concepts, the display device may include a chip-on-film package in which intentionally-cut wires (e.g., wires that are pre-cut, separate before folding/bending the film substrate of the chip-on-film package) are connected to each other by an anisotropic conductive film at a folding portion. Accordingly, it may be possible to prevent/protect the wire from being unintentionally cut at the folding portion of the chip-on-film package and consequently, prevent/protect signals from being incorrectly transmitted between a semiconductor chip and a display panel. In other words, the signals can be stably transmitted between the semiconductor chip and the display panel, and the chip-on-film package and the display device including the same can have high reliability.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A chip-on-film package, comprising:
    a film substrate comprising first and second surfaces on opposite sides, respectively, thereof;
    a semiconductor chip mounted on the first surface of the film substrate;
    a first wire on the second surface of the film substrate and adjacent an end portion of the film substrate;
    a second wire on the second surface of the film substrate, the second wire being spaced apart from the first wire along the second surface of the film substrate by a separation region positioned therebetween and being electrically connected to the semiconductor chip; and
    an anisotropic conductive film provided on a portion of the first wire and/or a portion of the second wire, the portion of the first wire and/or the portion of the second wire being positioned adjacent the separation region,
    wherein the film substrate comprises a folded shape that is folded at the separation region, and
    wherein the respective portions of the first and second wires are connected to each other via the anisotropic conductive film.

2. The chip-on-film package of claim 1,
    wherein the anisotropic conductive film comprises at least one conductive particle and an insulating material, and
    wherein the respective portions of the first and second wires are electrically connected to each other through the at least one conductive particle of the anisotropic conductive film.

3. The chip-on-film package of claim 1,
    wherein the respective portions of the first and second wires comprise respective first portions,
    wherein the first wire comprises:
        the first portion thereof adjacent the separation region; and
        a second portion thereof connected to the first portion thereof, and
    wherein the second wire comprises:
        the first portion thereof adjacent the separation region; and
        a second portion thereof connected to the first portion thereof, and
    wherein at least one of the first and second wires is configured such that the first portion thereof comprises a first width that is wider than a second width of the second portion thereof.

4. The chip-on-film package of claim 1, wherein a first width of the portion of the first wire is either narrower or wider than a second width of the portion of the second wire.

5. The chip-on-film package of claim 1, wherein a first thickness of the portion of the first wire is either thinner or thicker than a second thickness of the portion of the second wire.

6. The chip-on-film package of claim 1, further comprising:
    a conductive via layer connected to the second wire through the film substrate; and
    a third wire on the first surface of the film substrate and electrically connecting the semiconductor chip to the conductive via layer.

7. The chip-on-film package of claim 6, further comprising a fourth wire on the first surface of the film substrate and electrically connected to the semiconductor chip, wherein the third and fourth wires are adjacent opposite sides, respectively, of the semiconductor chip.

8. A display device, comprising:
    a panel substrate;
    a display substrate on the panel substrate;
    a circuit substrate; and
    a chip-on-film package,
    wherein the chip-on-film package comprises:
        a film substrate comprising:
            first and second surfaces on opposite sides, respectively, thereof; and
            a folding portion;
        a semiconductor chip mounted on the first surface of the film substrate;
        first and second wires on the second surface of the film substrate, the first wire being electrically connected to the panel substrate, and the second wire being spaced apart from the first wire along the second surface of the film substrate and being electrically connected to the semiconductor chip; and
        an anisotropic conductive film adjacent the folding portion, wherein the first and second wires are electrically connected to each other through the anisotropic conductive film.

9. The display device of claim 8,
    wherein the first wire comprises a first portion on the anisotropic conductive film, a second portion electrically connected to the panel substrate, and a third portion between the first and second portions, and
    wherein the second wire comprises a portion on the anisotropic conductive film.

10. The display device of claim 9,
    wherein the portion of the second wire that is on the anisotropic conductive film comprises a first portion of the second wire,
    wherein the second wire further comprises a second portion that is electrically connected to the first portion of the second wire, and
    wherein the chip-on-film package further comprises:
        a conductive via layer electrically connected to the second portion of the second wire through the film substrate; and a third wire on the first surface and electrically connecting the semiconductor chip with the conductive via layer.

11. The display device of claim 9,
wherein the anisotropic conductive film comprises at least one conductive particle and an insulating material, and
wherein the first portion of the first wire is electrically connected to the portion of the second wire through the at least one conductive particle of the anisotropic conductive film.

12. The display device of claim 9, wherein a first width of the first portion of the first wire is either narrower or wider than a second width of the portion of the second wire.

13. The display device of claim 9, wherein a first thickness of the first portion of the first wire is either thinner or thicker than a second thickness of the portion of the second wire.

14. The display device of claim 10, wherein the chip-on-film package further comprises a fourth wire on the first surface of the film substrate, the fourth wire comprising a first portion adjacent the semiconductor chip, a second portion adjacent the circuit substrate, and a third portion between the first and second portions.

15. The display device of claim 10, wherein:
the first portion of the first wire comprises a first width that is wider than a second width of the second portion of the first wire; and/or
the first portion of the second wire comprises a third width that is wider than a fourth width of the second portion of the second wire.

16. A display device comprising:
a package comprising:
  a semiconductor chip;
  a flexible substrate that is bent such that a first portion of a surface thereof is opposite a second portion of the surface;
  a first conductive region that is on the first portion of the surface of the flexible substrate and that is configured to electrically connect to the semiconductor chip;
  a second conductive region that is on the second portion of the surface of the flexible substrate; and
  a third conductive region that is between the first and second conductive regions and that is configured to electrically connect the first and second conductive regions; and
  a display panel that is adjacent the second conductive region and is configured to electrically connect to the second conductive region,
wherein the first conductive region comprises a first pre-cut wire,
wherein the second conductive region comprises a second pre-cut wire being spaced apart from the first wire along the surface of the flexible substrate,
wherein the third conductive region comprises an anisotropic conductive film.

17. The display device of claim 16, wherein:
the surface of the flexible substrate comprises a first surface of the flexible substrate;
the flexible substrate further comprises a second surface;
the first and second surfaces of the flexible substrate are on first and second opposite sides, respectively, of the flexible substrate;
the display device further comprises a fourth conductive region that is on the second surface of the flexible substrate and that is adjacent the semiconductor chip;
the display device further comprises a conductive via in the flexible substrate;

the first conductive region is configured to electrically connect to the fourth conductive region through the conductive via; and
the first conductive region is configured to electrically connect to the semiconductor chip through the fourth conductive region.

18. The display device of claim 17, wherein:
the package comprises a chip-on-film package;
the flexible substrate comprises a flexible film substrate;
the fourth conductive region comprises a third pre-cut wire; and
the display device is configured to transmit signals between the semiconductor chip and the display panel via the pre-cut wires.

19. The display device of claim 18, wherein:
the pre-cut wires comprise respective thermal conductivities higher than a thermal conductivity of the flexible film substrate;
the anisotropic conductive film is between a first portion of the first pre-cut wire and a first portion of the second pre-cut wire;
the chip-on-film package further comprises a void between the respective first portions of the first and second pre-cut wires and a bend of the flexible film substrate;
at least one of the first and second pre-cut wires comprises a second portion adjacent the first portion thereof; and
the chip-on-film package further comprises a wire protection layer on the second portion of the at least one of the first and second pre-cut wires.

20. A chip-on-film package, comprising:
a film substrate comprising first and second surfaces on opposite sides, respectively, thereof;
a semiconductor chip mounted on the first surface of the film substrate;
a first wire on the second surface of the film substrate and adjacent an end portion of the film substrate;
a second wire on the second surface of the film substrate, the second wire being spaced apart from the first wire along the second surface of the film substrate by a separation region positioned therebetween and being electrically connected to the semiconductor chip;
an anisotropic conductive film provided on a portion of the first wire and/or a portion of the second wire, the portion of the first wire and/or the portion of the second wire being positioned adjacent the separation region;
a conductive via layer connected to the second wire through the film substrate; and
a third wire on the first surface of the film substrate and electrically connecting the semiconductor chip to the conductive via layer.

21. The chip-on-film package of claim 20,
wherein the anisotropic conductive film comprises at least one conductive particle and an insulating material.

22. The chip-on-film package of claim 20,
wherein the respective portions of the first and second wires comprise respective first portions,
wherein the first wire comprises:
  the first portion thereof adjacent the separation region; and
  a second portion thereof connected to the first portion thereof, and
wherein the second wire comprises:
  the first portion thereof adjacent the separation region; and
  a second portion thereof connected to the first portion thereof, and wherein at least one of the first and second wires is configured such that the first portion thereof comprises a first width that is wider than a second width of the second portion thereof.

23. The chip-on-film package of claim 20, further comprising a fourth wire on the first surface of the film substrate and electrically connected to the semiconductor chip, wherein the third and fourth wires are adjacent opposite sides, respectively, of the semiconductor chip.

* * * * *